(12) United States Patent
Son et al.

(10) Patent No.: US 7,257,046 B2
(45) Date of Patent: Aug. 14, 2007

(54) MEMORY DATA ACCESS SCHEME

(75) Inventors: Jinshu Son, Saratoga, CA (US); Liqi Wang, Mt. View, CA (US); Minh V. Le, Richmond, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 54 days.

(21) Appl. No.: 11/151,332

(22) Filed: Jun. 13, 2005

(65) Prior Publication Data

US 2006/0280020 A1    Dec. 14, 2006

(51) Int. Cl.
*G11C 8/10* (2006.01)

(52) U.S. Cl. .......................... 365/230.03; 365/230.06; 365/238.5

(58) Field of Classification Search .............. 365/238.5
See application file for complete search history.

(56) References Cited

U.S. PATENT DOCUMENTS

| | | | | |
|---|---|---|---|---|
| 4,394,748 A | * | 7/1983 | Campbell, Jr. .............. | 365/104 |
| 4,779,272 A | * | 10/1988 | Kohda et al. ................ | 714/721 |
| 4,888,734 A | | 12/1989 | Lee et al. .................... | 365/185 |
| 5,034,926 A | * | 7/1991 | Taura et al. ........... | 365/185.14 |
| 5,182,725 A | * | 1/1993 | Andoh et al. .......... | 365/185.12 |
| 5,198,998 A | * | 3/1993 | Kobatake ................ | 365/185.27 |
| 5,457,650 A | * | 10/1995 | Sugiura et al. ............. | 365/184 |
| 5,708,605 A | * | 1/1998 | Sato ....................... | 365/185.29 |
| 5,748,528 A | | 5/1998 | Campardo | |
| 5,818,761 A | * | 10/1998 | Onakado et al. ........ | 365/185.18 |
| 6,141,250 A | * | 10/2000 | Kashimura ............. | 365/185.11 |
| 6,747,898 B2 | | 6/2004 | Abedifard .............. | 365/185.23 |
| 6,987,703 B2 | * | 1/2006 | Tanaka ........................ | 365/226 |
| 7,099,211 B2 | * | 8/2006 | Jeong et al. ................. | 365/201 |
| 2003/0117848 A1 | | 6/2003 | Hoang .................... | 365/185.11 |
| 2004/0004860 A1 | | 1/2004 | Abedifard .............. | 365/185.11 |

\* cited by examiner

*Primary Examiner*—Tan T. Nguyen
(74) *Attorney, Agent, or Firm*—Schneck & Schneck; Thomas Schneck

(57) ABSTRACT

A bitline selection network is composed of a plurality of bitlines and a plurality of global bitlines. The bitlines are grouped into bytes with eight bitlines per byte. The bitlines provide access to memory cells for read and write operations. A bitline is connected to a global bitline through a bitline select transistor. Each of the bitline select transistors is activated one at a time by a bitline select controller. Activation of each bitline select transistor provides a connection to a source line, which in turn connects to a sense amplifier and a write data loading logic block. The sense amplifier and the write data loading logic block are used in read and write operations respectively.

10 Claims, 7 Drawing Sheets

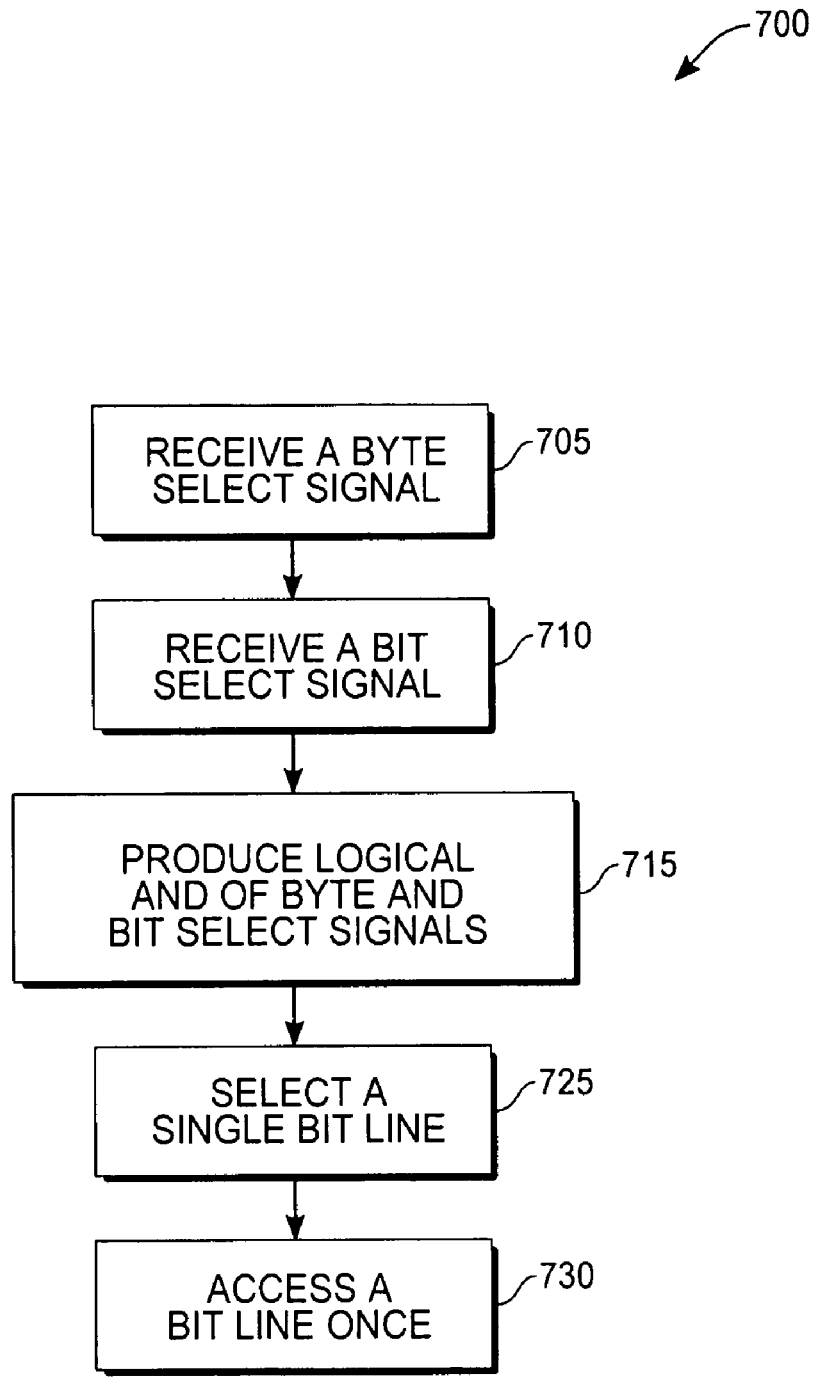
Fig._7

MEMORY DATA ACCESS SCHEME

TECHNICAL FIELD

The present material relates to a semiconductor integrated circuit device, and more particularly to a memory circuit incorporating multiple column decoder connections.

BACKGROUND ART

In FIG. 1, bitlines for accessing an array of memory locations are grouped into bytes in a prior art data selection schematic 100. Eight bitlines (e.g., BL07, BL06, ..., BL00) are grouped into a byte. For BYTE 0 the eight bits are organized from most significant to least significant positions as BL07, BL06, ..., BL00. A plurality of bytes of bitlines (BYTE 0, BYTE 1, ..., BYTE n) represent n+1 bytes of bitlines used for accessing the array of memory locations. In BYTE 0 the eight bitlines connect to a respective set of column latches (CL07, CL06, ..., CL00) used to store write data. Connections to a plurality of bit memory locations (not shown) lay along the extent of a bitline. A memory location is selected for access in a reading or writing operation when its respective bitline and a wordline (not shown) are selected. The wordline typically addresses one or more bytes of bit memory locations. The bitline is a primary electrical communication element feeding into an access network providing connection of the memory locations to a read or write circuit.

Bitlines for a byte of memory locations are selected by a group of eight bitline select transistors. For instance, for BYTE 0, eight bitline select transistors BLST07, BLST06, ..., BLST00 are selected in parallel. Other sets of eight bitline select transistors (BLST17, BLST16, ..., BLST10; ...; BLSTn7, BLSTn6, ..., BLSTn0) operate similarly. A bitline select transistor is typically an NMOS field effect transistor. At any time, one of the n+1 byte select lines (BS0, BS1, ..., BSn) is activated enabling connection of one byte of bitlines to a set of eight global bitlines (GBL7, GBL6, ..., GBL0). A byte select controller 150 ensures that only one byte select line is activated at a time. Only a single byte is selected at one time. The byte select controller 150 ensures a single byte is selected by only enabling one of the byte select lines (BS0, BS1, ..., BSn) at a time.

The global bitlines provide connection for a single bit position across all bytes of the array of memory locations. The global bitline (GBL7) for bit position seven, for instance, connects to a bitline in the seventh bit position (BL07, BL17, ..., BLn7) of any byte selected in the memory array. Eight bit select transistors (BST7, BST6, ..., BST0) provide connection of the global bitlines to a source line 188. A global bitline connection is achieved when one of eight respective bit select lines (BSL7, BSL6, ..., BSL0) at a time receives a select signal from a bit select controller 185. The source line 188 connects to an input of a sense amplifier 195 and an output of a write data loading logic block 190. The sense amplifier 195 and the write data loading logic block 190 are the circuits used in a read operation and a write operation respectively.

With reference to FIG. 2, byte select signals coincide with bit select signals in a prior art data selection waveform 200 to control a bitline selection. Each of the n+1 byte select signals (BYTS0, BYTS1, ..., BYTSn) corresponds to a respective byte select line (BS7, BS6, ..., BS0) of FIG. 1. In a sequential access operation, one of n+1 byte select signals is activated for eight cycles at a time. Each of the eight cycles of one of the n+1 byte select signals (BYTS0, BYTS1, ..., BYTSn) correspond to a sequence through eight bit selects signals (BSS7, BSS6, ..., BSS0). The eight bit select signals (BSS7, BSS6, ..., BSS0) are applied to the respective eight bit select lines (BSL7, BSL6, ..., BSL0) of FIG. 1. A memory location in BYTE 0 bit position seven (BL07) is accessed when a corresponding wordline, a first cycle of byte select signal zero (BYTS0), and bit select signal seven (BSS7) are active. In a write operation, bit select signal seven (BSS7) activates bit select transistor seven (BST7) and byte select signal zero (BYTS0) activates bitline select transistor zero-seven (BLST07) establishing an electrical connection between the write data loading logic block 190 and a column latch zero-seven (CL07) of BYTE 0.

In the case of a large memory and correspondingly large global bitlines, any one of the global bitlines may become charged to a high voltage level during a write cycle. During extremely low frequency operation and due to capacitive losses, a high voltage level on a global bitline may be discharged over time to a voltage level low enough to be recognized as a low logic level. No active source maintains the high voltage level on the global bitline until a successive write cycle at the same bit position. The global bit line is coupled to a corresponding column latch during each of the eight write cycles of the associated byte. On a succeeding access, due to discharging of the global bitline, a low logic level will be coupled to a column latch. The global bit line has sufficiently large capacitance, that when charge sharing occurs during coupling to the relatively small capacitance of the column latch, the low logic level on the global bit line effectively writes a low logic state to the column latch.

DISCLOSURE OF INVENTION

A bitline selection network is composed of a plurality of bitlines and one or more global bitlines. The bitlines provide access to memory cells for read and write operations. The bitlines are grouped into bytes with eight bitlines per byte. A bitline is connected to a global bitline through a bitline select transistor. Each of the bitline select transistors is activated one at a time by a bitline select controller. At most one bitline is activated at a time. There need not be a bitline activated at all times. In certain modes and under certain conditions there may be no bitline selected. This may occur for example, during a test mode or power on condition. Activation of each bitline select transistor provides a connection to a global bitline which in turn connects to a sense amplifier and a write data loading logic block. The sense amplifier and the write data loading logic block are used in read and write operations respectively. With a complete selection of a bitline either the write data loading logic block may be used to program a memory cell or the sense amplifier used to read a memory cell.

BRIEF DESCRIPTION OF DRAWINGS

FIG. 7 is an exemplary process flow diagram of a bitline selection method.

BEST MODE FOR CARRYING OUT THE INVENTION

Figure 1:
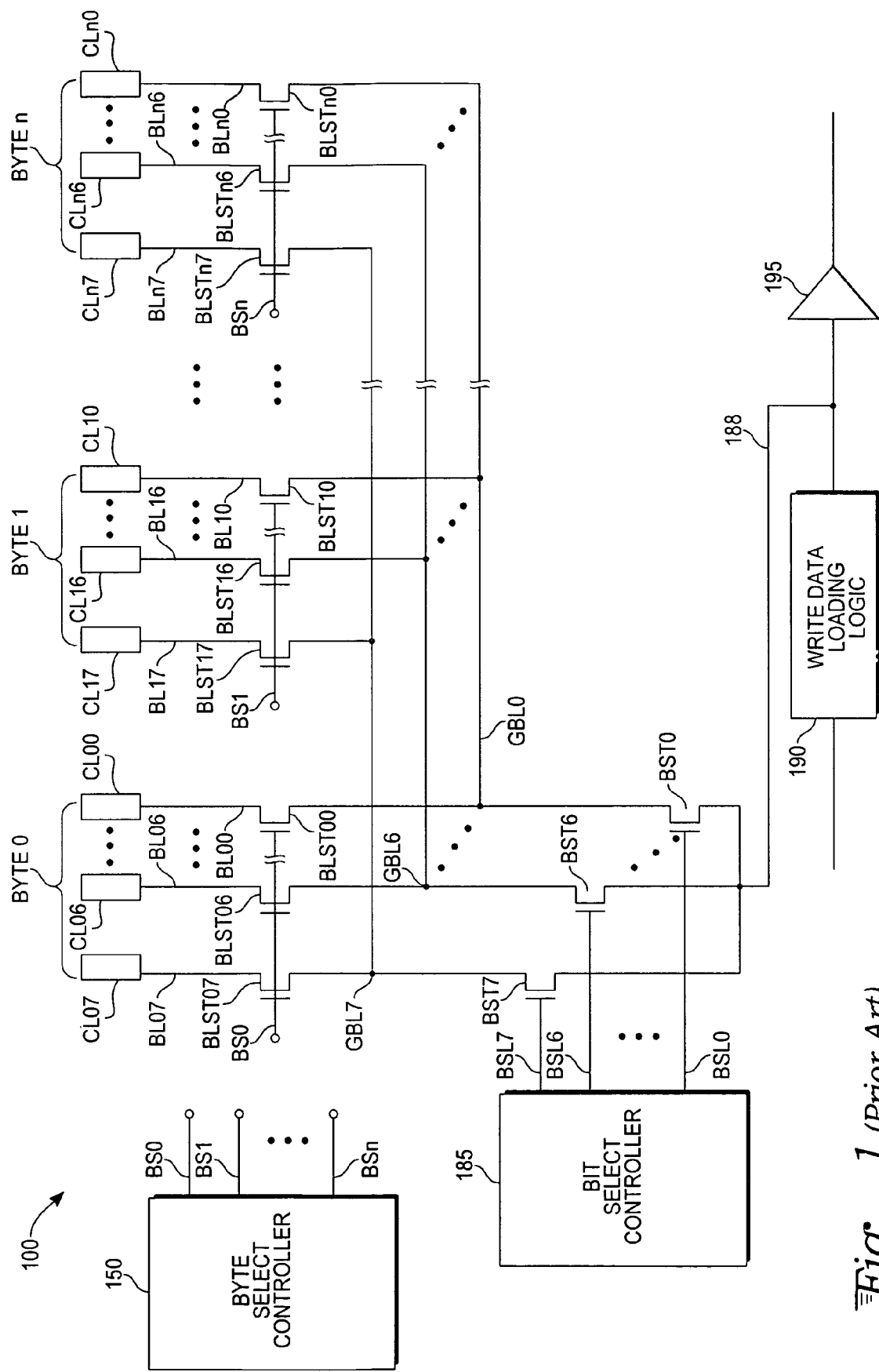
FIG. 1 is a prior art bitline selection schematic diagram.
Figure 2:
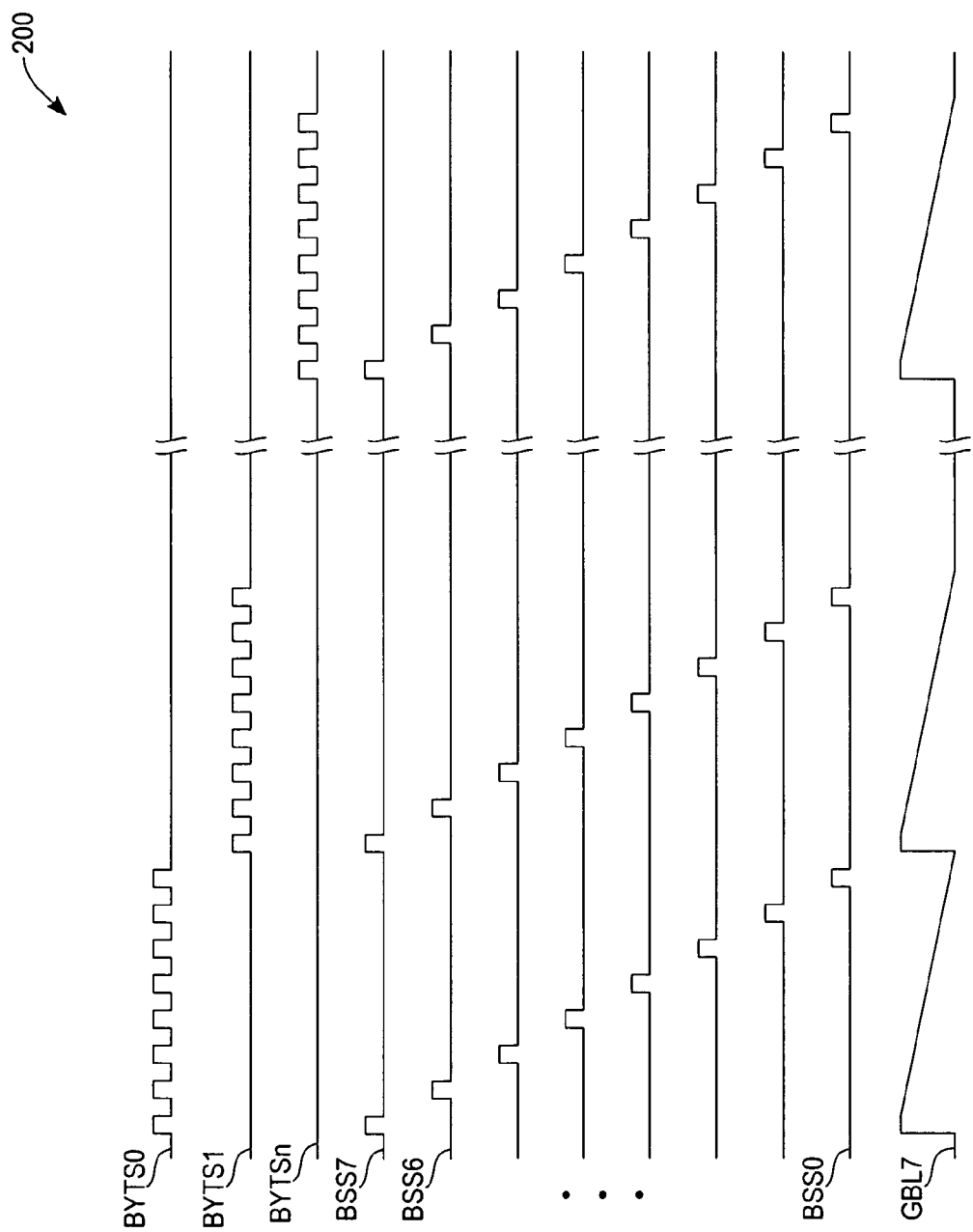
FIG. 2 is a prior art bitline selection waveform diagram.
Figure 3:
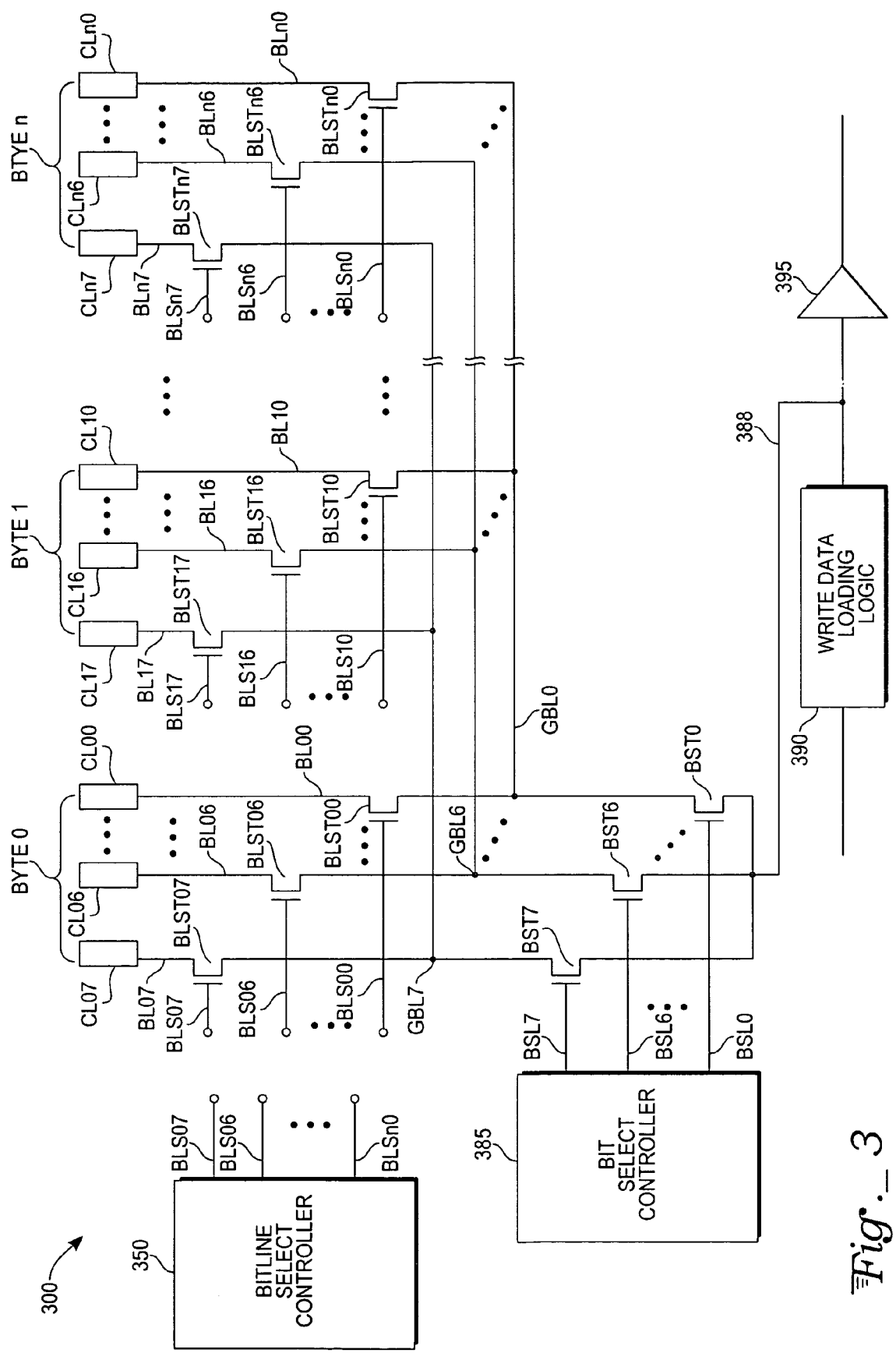
FIG. 3 is an exemplary bitline selection schematic diagram.

With reference to FIG. 3, bitlines for a byte of memory locations are selected by a group of eight bitline select transistors. For instance, for BYTE 0, eight bitline select transistors BLST07, BLST06, . . . , BLST00 select eight respective bitlines BL07, BL06, . . . , BL00. Each of the remaining bytes (BYTE 1, . . . , BYTE n) have a corresponding set of eight bitline select transistors (BLST17, BLST16, . . . , BLST10; . . . ; BLSTn7, BLSTn6, . . . , BLSTn0). A bitline select transistor may be implemented, for example, with an NMOS field effect transistor. Each bitline select transistor is accessed through a bitline select line. Typically, at most one of the bitline select transistors is activated at any time. The single bitline selection enables connection of one bitline to one of a set of eight global bitlines (GBL7, GBL6, . . . , GBL0). It is not necessary that a bitline be selected at all times. For example, during a device bring up cycle or for certain testing modes, no bitlines need be selected.

A bitline select controller 350 ensures that at most only one bitline select transistor is activated at a time. The bitline select controller 350 connects to each of the bitline select transistors (BLST07, BLST06; . . . ; BLSTn0) through the respective bitline select lines (BLS07, BLS06, . . . , BLS00; BLS17, BLS16, . . . , BLS10; . . . ; BLSn7, BLSn6, . . . , BLSn0). The global bitlines provide connection for a single bit position across all bytes of the memory location array. The global bitline (GBL7) for bit position seven, for instance, connects to a bitline in the seventh bit position (BL07; BL17; . . . ; BLn7) of any byte in the memory array. Eight bit select transistors (BST7, BST6, . . . , BST0) provide connection of the global bitlines to a source line 388. A global bitline connects to the source line 388 when one of eight respective bit select lines (BSL7, BSL6, . . . , BSL0) at a time receives a select signal from a bit select controller 385. The source line 388 connects to an input of a sense amplifier 395 and an output of a write data loading logic block 390. The sense amplifier 395 and the write data loading logic block 390 are the circuits used in a read operation and a write operation respectively.

Figure 4:
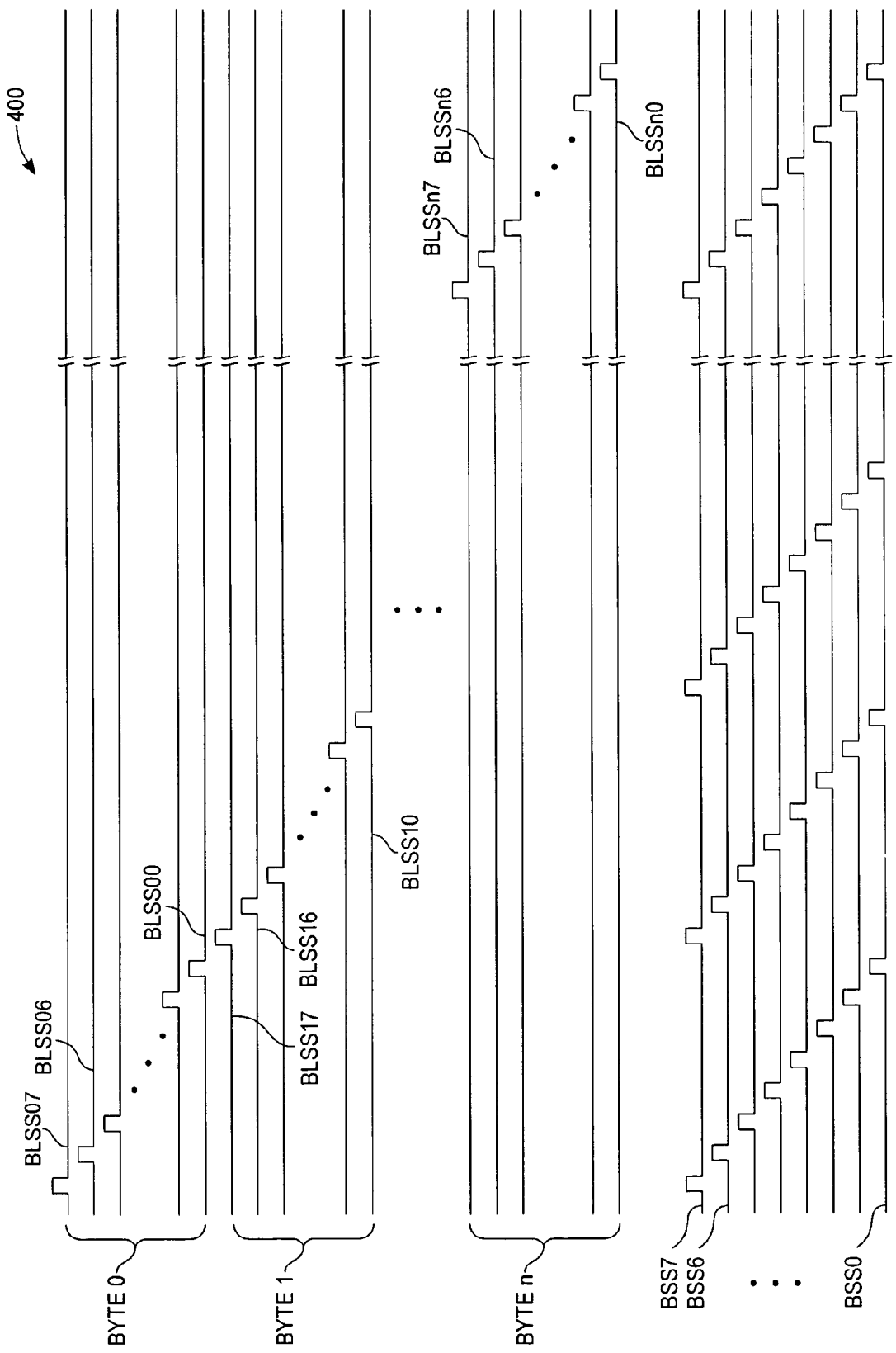
FIG. 4 is an exemplary bitline selection waveform diagram in accordance with the circuit of FIG. 3 with bit select signaling.

With reference to FIG. 4, bitlines are selected by bitline select signals coinciding with bit select signals in a data selection waveform 400. Each bitline select signal (BLSS07, BLSS06, . . . , BLSS00; BLSS17, BLSS16, . . . , BLSS00; BLSSn7, BLSSn6, . . . , BLSSn0) corresponds to a respective bitline select transistor (BLST07, BLST06; . . . ; BLSTn0) of FIG. 3. At most one of the bitline select signals is activated for one cycle at a time. Each cycle of one of the bitline select signals (BLSS07, BLSS06, . . . , BLSSn0) relates to one of the bit select signals (BSS7, BSS6, . . . , BSS0) of corresponding significance. The eight bit select signals (BSS7, BSS6, . . . , BSS0) are applied to the respective eight bit select lines (BSL7, BSL6, . . . , BSL0) of FIG. 3. A memory location connected to the bitline in BYTE 0 bit position seven (BL07) is accessed when a corresponding wordline, a respective bitline select signal (BLSS07), and bit select signal seven (BSS7) are active.

Figure 5:
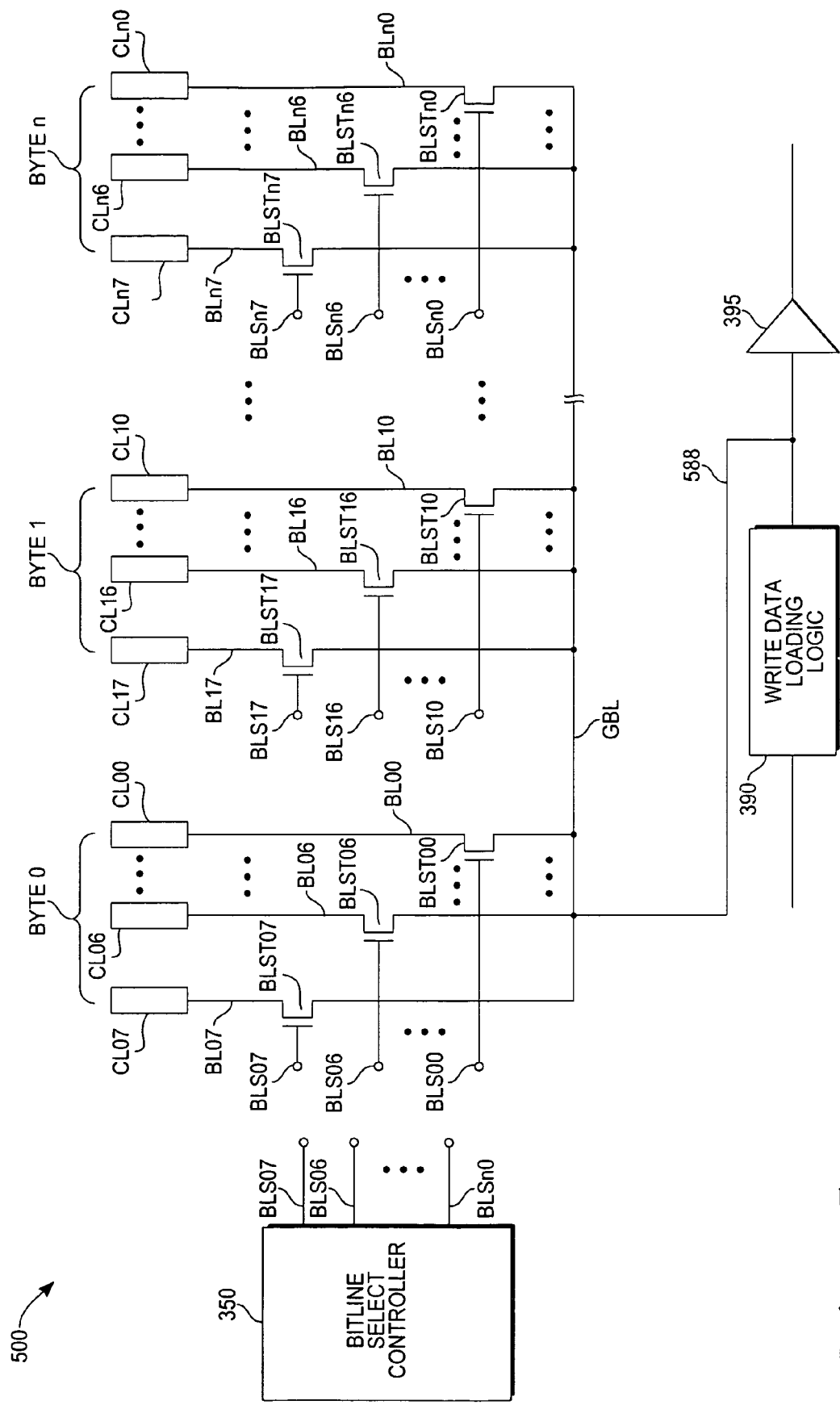
FIG. 5 is another exemplary bitline selection schematic diagram.

With reference to FIG. 5, bitlines for a byte of memory locations are selected by a group of eight bitline select transistors. For instance, for BYTE 0, eight bitline select transistors (BLST07, BLST06, . . . , BLST00) select eight respective bitlines (BL07, BL06, . . . , BL00). Each of the remaining bytes (BYTE 1, . . . , BYTE n) have a corresponding set of eight bitline select transistors (BLST17, BLST16, . . . , BLST10; . . . ; BLSTn7, BLSTn6, . . . , BLSTn0) per byte. An access of a bitline by each bitline select transistor is controlled through a bitline select line (BLS07, BLS06, . . . , BLS00; BLS17, BLS16, . . . , BLS10; . . . ; BLSn7, BLSn6, . . . , BLSn0). Typically, at most one of the bitline select transistors is activated, enabling connection of one bitline to a global bitline GBL, at any time. It is not necessary that a bitline be selected at all times. For example, during a device bring up cycle or for certain testing modes, no bitlines need be selected.

A bitline select controller 350 ensures that at most one bitline select transistor is activated at a time. The bitline select controller 350 connects to each of the bitline select transistors (BLST07, BLST06, . . . , BLSTn0) through the respective bitline select lines (BLS07, BLS06, . . . , BLS00; BLS17, BLS16, . . . , BLS10; . . . ; BLSn7, BLSn6, . . . , BLSn0). The global bitline provides a common connection for all bit positions across all bytes of the memory location array. The global bitline GBL connects to a source line 588. The source line 588 connects to an input of a sense amplifier 395 and an output of the write data loading logic block 390. The sense amplifier 395 and the write data loading logic block 390 are the circuits used in a read operation and a write operation respectively.

Figure 6:
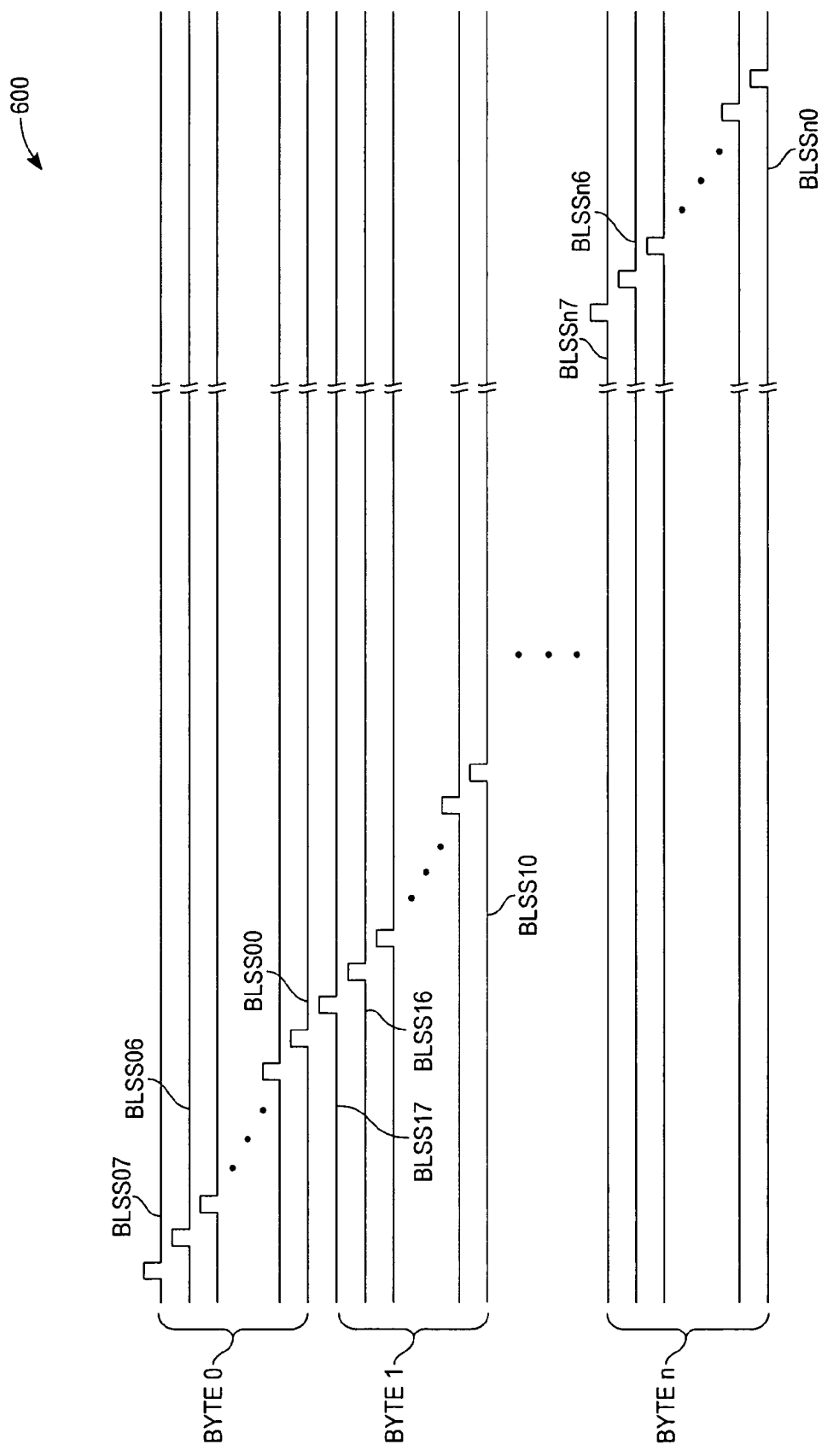
FIG. 6 is a bitline selection waveform diagram in accordance with the circuit in a FIG. 5.

With reference to FIG. 6, bitline select signals determine access to a memory location in a data selection waveform 600. Each of bitline select signals (BLSS07, BLSS06, . . . , BLSS00; BLSS17, BLSS16, . . . , BLSS10; . . . ; BLSSn7, BLSSn6, . . . , BLSSn0) corresponds to a respective bitline select transistor (BLST07, BLST06, . . . , BLSTn0) of FIG. 5. At most one of the bitline select signals is activated for one cycle at a time. A memory location connected to the bitline in BYTE 0 bit position seven (BL07), for instance, is accessed when a corresponding wordline and a respective bitline select signal (BLSS07) are active.

With reference to FIG. 7, a data selection process commences with receiving 705 a byte select signal followed by receiving 710 a bit select signal. The process continues with producing 715 a selection signal from a logical AND of the byte select signal and the bit select signal. A next step of the process is selecting 725 a single bitline at a time based on the selection signal and accessing 730 a bitline once in a read or write operation of a memory device based on the selection signal.

Although certain circuits and logic structures are shown as exemplary embodiments, a skilled artisan will recognize that other approaches exist for effecting particular circuit elements, such as switches. For instance, although a bitline selection switch is exemplified as an n-type enhancement-mode insulated-gate field-effect transistor, an artisan of circuit design could readily adapt a junction field-affect transistor, a depletion-mode insulated-gate field-effect transistor, or an p-type enhancement-mode insulated-gate field-effect transistor to effect a similar switching result.

What is claimed is:

1. A bitline selection network, the network comprising:
a plurality of bitlines, said plurality of bitlines coupled to provide access in reading and writing to a plurality of memory cells;
a plurality of bitline select switches, each of said plurality of bitline select switches is coupled to one of said plurality of bitlines, said plurality of bitline select switches configured to provide at most only a single coupling to a single one of said plurality of bitlines at a time;

a plurality of bitline select lines, each of said plurality of bitline select lines being coupled to one of said plurality of bitline select switches and is configured to provide independent control of each of said plurality of bitline select switches;

a plurality of global bitlines, each of said global bitlines being coupled to a subset of said plurality of bitline select switches and configured to provide a common point of coupling to each of said subsets of said plurality of bitline select switches;

a plurality of bit select switches, each of said bit select switches is coupled to one of said plurality of global bitlines; and a plurality of bit select lines, each of said plurality of bit select lines coupled to one of said plurality of bit select switches and electrically coupled to said plurality of memory cells in read and write operations.

2. The network of claim 1, wherein a coupling of one of said plurality of bit select switches to one of said plurality of bitlines occurs once during a read or write operation.

3. The network of claim 1, wherein a coupling of a first one of said plurality of bitlines to one of said plurality of bit select lines in a previous read or write operation is electrically separate from a coupling of one of said plurality of bit select lines to a second one of said plurality of bitlines in a subsequent read or write operation.

4. The network of claim 3, wherein said separate coupling alleviates any contention between said electrical communications of said read and write operations with said plurality of memory cells.

5. A bitline selection system, the system comprising:

a plurality of bitlines, said plurality of bitlines coupled to provide access in reading and writing to a plurality of memory cells;

a plurality of bitline select switches, each of said plurality of bitline select switches is coupled to one of said plurality of bitlines, said plurality of bitline select switches configured to provide at most only a single coupling to a single one of said plurality of bitlines at a time;

a bitline select controller, said bitline select controller coupled to said plurality of bitline select switches and configured to activate one of said plurality of bitline select switches at a time;

a plurality of global bitlines, each of said plurality of global bitlines being coupled to a subset of said plurality of bit lines;

a plurality of bit select switches, each of said bit select switches is coupled to one of said plurality of global bitlines;

a bit select controller, said bit select controller coupled to said plurality of bit select switches and configured to activate one of said bit select switches at a time;

a source line, said source line being coupled to said plurality of bit select switches and configured to provide electrical communication with said plurality of memory cells in read and write operations;

a write data loading logic block, said write data loading logic block coupled to said source line and configured to write a data content used in a write operation; and a sense amplifier, said sense amplifier coupled to said source line and configured to acquire a content of a memory cell in a read operation.

6. The system of claim 5, wherein a coupling of said source line to one of said plurality of bitlines occurs once during a read or write operation.

7. The system of claim 5, wherein a coupling of a first one of said plurality of bitlines to said source line in a previous read or write operation is electrically separate from a coupling of said source line to a second one of said plurality of bitlines in a subsequent read or write operation.

8. The system of claim 7, wherein said separate coupling alleviating any contention between said electrical communications of said read and write operations with said plurality of memory cells and preserving an integrity of a content of said write data loading logic block.

9. A bitline selection apparatus, the apparatus comprising:

an amplification means for accepting an input signal and providing an output signal;

a writing means for writing an input signal and providing an output programming signal;

a bitline selection means for selecting one of a plurality of bitline signals as an input signal to one of a plurality of global bitlines;

a bitline addressing means for controlling selection of one of a plurality of bitline signals at a time, the plurality of bitline signals conveying a number of unique instances of bitlines equal in number to the plurality of bitline selection means;

a bit selection means for either selecting one of a plurality of global bitline signals as input to said amplification means or for selecting said output signal of said writing means as an input programming signal to a plurality of storage locations; and a bit addressing means for controlling selection of one of a plurality of global bitline signals at a time, the plurality of global bitline signals conveying a number of unique instances of said global bitlines equal in number to the plurality of bit selection means.

10. A method of selecting a bitline, the method comprising:

receiving a byte select signal;

receiving a bit select signal;

combining said byte select signal and said bit select signal;

producing a selection signal;

selecting a single bitline at a time; and accessing a bitline once in a memory device read or write operation.

* * * * *